(12) United States Patent
Nakano et al.

(10) Patent No.: US 6,767,752 B2
(45) Date of Patent: Jul. 27, 2004

(54) TEMPERATURE CONTROL METHOD AND SEMICONDUCTOR DEVICE MANUFACTURING METHOD

(75) Inventors: Minoru Nakano, Tokyo (JP); Masaaki Ueno, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 10/212,146

(22) Filed: Aug. 6, 2002

(65) Prior Publication Data

US 2003/0040198 A1 Feb. 27, 2003

(30) Foreign Application Priority Data

Aug. 7, 2001 (JP) ........................................ 2001-238606
Jul. 17, 2002 (JP) ........................................ 2002-207739

(51) Int. Cl.[7] ............................................. H01L 21/00
(52) U.S. Cl. ................................ 438/7; 438/14; 438/15
(58) Field of Search ................................. 438/7, 14, 15

(56) References Cited

U.S. PATENT DOCUMENTS

| | | | | |
|---|---|---|---|---|
| 4,890,245 A | * | 12/1989 | Yomoto et al. | 702/135 |
| 5,356,756 A | * | 10/1994 | Cavicchi et al. | 430/315 |
| 5,851,842 A | * | 12/1998 | Katsumata et al. | 438/9 |
| 5,963,840 A | * | 10/1999 | Xia et al. | 438/783 |
| 6,121,061 A | * | 9/2000 | Van Bilsen et al. | 438/14 |
| 6,197,601 B1 | * | 3/2001 | Hirashita | 438/5 |
| 6,238,085 B1 | * | 5/2001 | Higashi et al. | 374/10 |
| 6,337,219 B1 | * | 1/2002 | Nishikawa | 438/14 |
| 6,437,290 B1 | * | 8/2002 | Shao et al. | 219/390 |
| 6,587,744 B1 | * | 7/2003 | Stoddard et al. | 700/121 |
| 2002/0180449 A1 | * | 12/2002 | Ushiku et al. | 324/464 |
| 2003/0040198 A1 | * | 2/2003 | Nakano et al. | 438/795 |

FOREIGN PATENT DOCUMENTS

JP  05-190462  7/1993

* cited by examiner

Primary Examiner—John F. Niebling
Assistant Examiner—Olivia T Luk
(74) Attorney, Agent, or Firm—McGinn & Gibb, PLLC

(57) ABSTRACT

A temperature control method is provided which is capable of maintaining the accuracy of control based on a detected value of a temperature sensor substantially constant regardless of a change in an error of measurements of the temperature sensor. Measured values of thermocouples 7A, 7B, 7C of a thermocouple thermometer and those of sensor members 6A, 6B, 6C of a radiation thermometer 6 of a sheet-feed apparatus are detected as the processing proceeds. A temperature control parameter of the sheet-feed apparatus is made to change based on differences between the detected temperature values as the processing proceeds.

19 Claims, 2 Drawing Sheets view seen from above

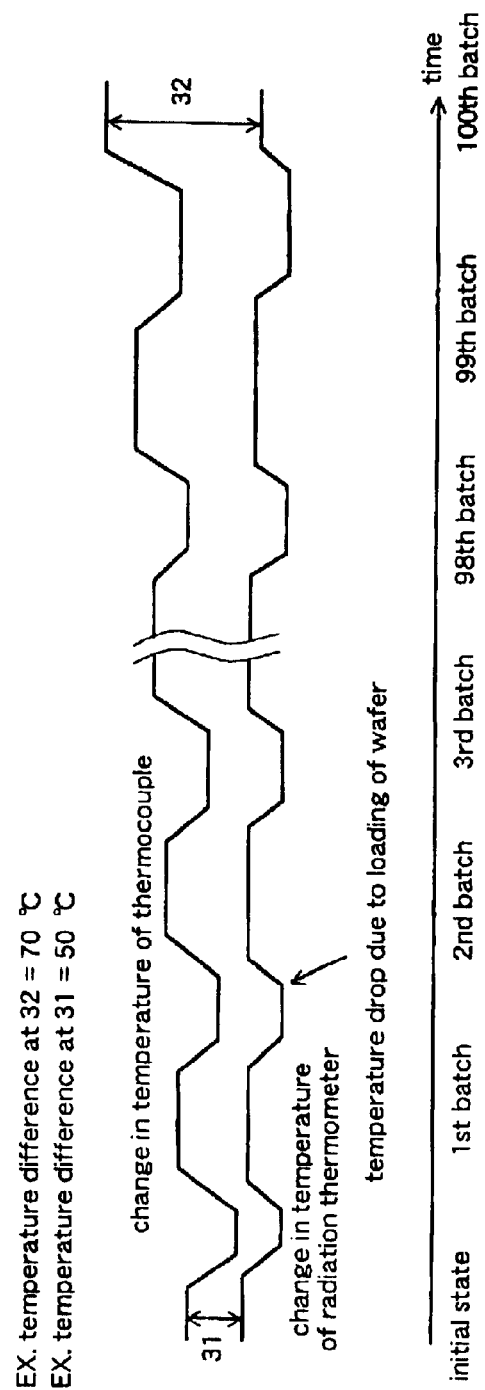

TEMPERATURE CONTROL METHOD AND SEMICONDUCTOR DEVICE MANUFACTURING METHOD

BACKGROUND OF THE INVENTION

1. Field of the Invention

The present invention relates to a semiconductor manufacturing apparatus equipped with a heating furnace, and more particularly, it relates to a method of controlling the temperature of a heating furnace and a method for manufacturing semiconductor devices.

2. Description of the Related Art

For instance, in a sheet-feed apparatus, a reactive gas is supplied to a heating furnace to form thin films on a substrate such as a silicon wafer while heating the interior of the heating furnace, in which the substrate is accommodated, at a prescribed temperature. In the manufacture of semiconductor devices, the temperature condition of the heating furnace is critical, and hence the accuracy of the temperature control has a great influence on the quality of thin films formed. A radiation thermometer can accurately measure the temperature of an object to be detected without contact therewith and has excellent response. Thus, the radiation thermometer has conventionally been used for the manufacture of semiconductor devices. In addition, Japanese Patent Application Laid-Open No. 5-190462 discloses a plasma CVD apparatus. In this CVD apparatus, a radiation thermometer is used to measure the temperature of a glass substrate. In order to correct errors in the measurements of the radiation thermometer due to infrared rays radiated from a susceptor, correlation data between the temperature of the susceptor and the temperature of the glass substrate to the temperature indication of the infrared radiation thermometer is set beforehand. The temperature of the glass substrate detected by the radiation thermometer is corrected in accordance with the temperature of the susceptor detected by a thermocouple based on the correlation data, so that the temperature of the susceptor is controlled by the thus corrected temperature of the glass substrate.

However, in a deposition processing apparatus such as a chemical vapor deposition (CVD) apparatus, in case where a radiation thermometer is arranged in a reaction chamber, thin films are deposited on the radiation thermometer itself. In addition, in case where the radiation thermometer is arranged outside the reaction chamber through a chamber window, deposition is made on the chamber window. In either case, accuracy in the temperature measurements reduces with the passage of time. Thus, even if corrections are carried out based on the correlation data between the temperature of the susceptor and the temperature of the glass substrate, errors in the measurements of the radiation thermometer itself increase as deposition processing is carried out repeatedly. As a result, even if the above-mentioned error corrections are carried out, it is impossible to detect the true temperature of the glass substrate and hence to perform highly accurate temperature control.

SUMMARY OF THE INVENTION

The present invention has been made in view of the above-mentioned circumstances, and has for its object to provide a temperature control method and a semiconductor device manufacturing method which are capable of performing excellent temperature control without reducing its control accuracy even if there takes place a change in the measurement error of a temperature sensor due to the deposition of thin films thereon or the like.

In order to solve the above-mentioned problems, according to one aspect of the present invention, there is provided a temperature control method for performing temperature control based on a detected value of a control temperature sensor and a temperature control parameter. The temperature control method includes determining in advance a correction value for the temperature control parameter that changes in accordance with the progress of the processing of a substrate; and making the temperature control parameter to be changed in accordance with the correction value thus determined when the substrate is processed.

Preferably, the temperature control method further includes determining in advance a first temperature control parameter in an initial stage and a second temperature control parameter after a prescribed amout or number of processes have been carried out for a reference temperature sensor and the control temperature sensor; determining a change rate of the temperature control parameter from the first temperature control parameter, the second temperature control parameter and the number of processes performed; and making the temperature control parameter to be changed at the change rate.

In an embodiment, temperature control is carried out by making the temperature control parameter to be changed through correction at a prescribed interval. Here, note that the term "prescribed interval" means any one of "every batch", "every several batches" and "every fixed period of time". In addition, the term "temperature control parameter" means any one of "a temperature correction value" (e.g., a difference between the measured value of the susceptor temperature (the measurement of the radiation thermometer) and the measured value of the heater temperature (the measurement of the thermocouple thermometer)), "a PID constant" and "an alarm constant". Such a correction can be made as follows. When the temperature control parameter is assumed to be a difference between the measured value of the temperature sensor (radiation thermometer) in which an error is caused and the measured value of a reference temperature sensor (thermocouple thermometer) which becomes a reference, for instance, a difference in the temperature control parameter before and after a prescribed number of processes (for instance, 100 batches) (i.e., a difference between the measured temperatures of the respective sensors before and after the processing) is acquired beforehand, and at the time of control operation, a more reliable temperature difference is obtained by using the ratio of the amount or number of processes thus far processed to the prescribed amount or number of processes as the processing proceeds. However, other corrections such as non-linear approximation and so on may be carried out. Note that upon acquisition of the difference between the temperature control parameter values, the temperature of the furnace for instance is controlled so as to make substantially constant the measured values of the temperature sensor containing an error, whereas during control operation, control is performed in such a manner that the measured value of the temperature sensor containing an error is made equal to the prescribed temperature by using the temperature control parameter that has been corrected with the measured temperature of the temperature sensor being made as a reference.

Preferably, the control temperature sensor is a radiation thermometer arranged in a processing apparatus having a heater, and the reference temperature sensor is a thermocouple thermometer.

Since the temperature of an object to be controlled can be directly measured without any contact by using the radiation thermometer, the response of measurements is excellent and hence the temperature of the object to be controlled can be accurately controlled to a prescribed temperature in a short period of time. In addition, the thermocouple thermometer is subjected to a reduced change over time or reduced aging even in CVD processing, and hence it is possible to more accurately correct the control parameter based on measurements that change over time.

Preferably, the temperature control parameter is made to change by correction at a prescribed interval. Preferably, the prescribed interval may be any one of every batch, every several batches, and every fixed period of time.

Preferably, the radiation thermometer is arranged in the vicinity of a susceptor in a reaction chamber of the processing apparatus, whereby accuracy in temperature measurements can be improved, thus making it possible to enhance the temperature control accuracy.

Preferably, the processing apparatus comprises a CVD apparatus. Accordingly, in CVD processing, even if thin films are deposited on the radiation thermometer, temperature control can be carried out accurately.

With the above arrangement, by making the temperature control parameter to be changed in accordance with a change in the error of measurements of the temperature sensor, it is possible to perform the temperature control without reducing its control accuracy even if there takes place a change in the measurement error of the temperature sensor due to the deposition of thin films thereon, etc.

According to another aspect of the present invention, there is provided a method for manufacturing semiconductor devices in which the temperature of a heater arranged in a reaction chamber is controlled by using a temperature value detected by a control temperature sensor and a parameter for temperature control so that the temperature of a substrate is controlled to deposit thin films on the substrate, thus manufacturing a semiconductor device. The method includes determining in advance a correction value for the temperature control parameter that changes in accordance with the progress of the processing of said substrate, and making the temperature control parameter to be changed in accordance with the correction value thus determined when the substrate is processed.

With such a semiconductor device manufacturing apparatus using the above temperature control method, temperature control can be carried out with high accuracy, thus making it possible to manufacture semiconductor devices of excellent quality.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

FIG. 2 is a view showing the relation between the actually measured temperatures of a thermocouple thermometer and a radiation thermometer with respect to the number of batches.

DESCRIPTION OF THE PREFERRED EMBODIMENT

Now, a preferred embodiment of the present invention will be described below in detail while referring to the accompanying drawings.

Figure 1A:
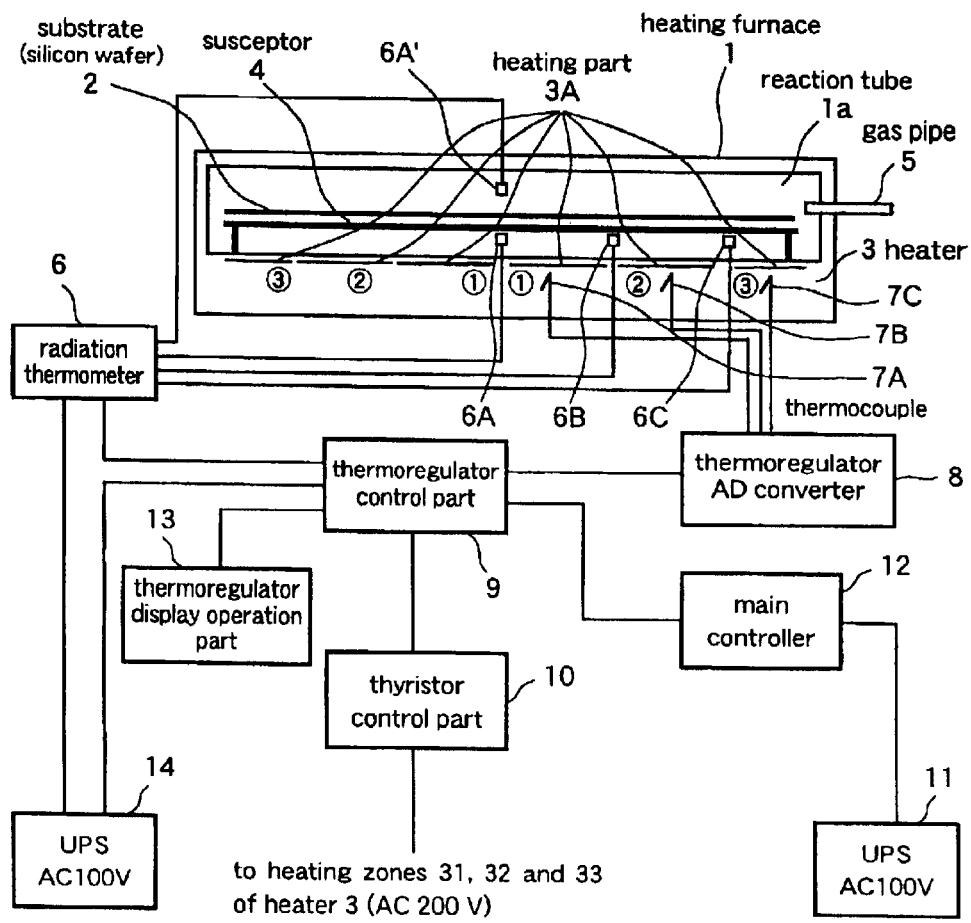
FIG. 1(a) is a view showing the overall arrangement of a heating furnace used to carry out a temperature control method and a semiconductor device manufacturing method according to the present invention.
Figure 1B:
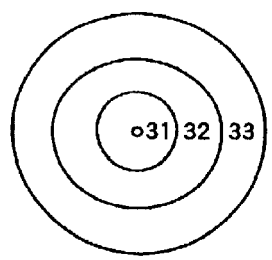
FIG. 1(b) is a top plan view of the heating furnace when seen from above.

FIGS. 1(a) and 1(b) show the configuration of a heating furnace used to carry out the methods of the present invention, in which FIG. 1(a) is a view showing the overall configuration thereof, and FIG. 1(b) is a top plan view of the heating furnace as seen from above. FIG. 2 is a view showing the change of the temperature of a thermocouple when a radiation thermometer is controlled to be at a constant temperature.

In FIGS. 1(a) and 1(b), in case of a sheet-feed apparatus, a substrate 2 such as a silicon wafer is accommodated in a heating furnace 1 having a reaction tube 1a, the interior of which is heated to a prescribed temperature, a reactive gas is supplied to the heating furnace 1 to form thin films on the substrate 2 while being exhausted therefrom through an unillustrated exhaust pipe. Heat from a heat source in the form of a heater 3 having a heating part 3A with three zones 31, 32, 33 is absorbed mainly by the substrate 2, a susceptor 4 with a substantial thermal capacity supporting the substrate 2, and the reactive gas flowing into the heating furnace 1 from a gas pipe 5.

A radiation thermometer 6 in the form of an infrared radiation thermometer including a plurality of sensor members 6A', 6A–6C and a thermocouple thermometer including a plurality of thermocouples 7A–7C used for the purpose of heater monitoring or heater control are arranged, as control sensors, in the heating zones 31, 32, 33, respectively. A thermoregulator AD converter 8 receives the output signals of the thermocouples 7A–7C, converts them from analog into digital form, and sends temperature digital data thus obtained to a thermoregulator control part 9. The radiation thermometer 6 also similarly converts the output signals of the respective sensor members 6A', 6A–6C from analog into digital form, and sends temperature digital data thus obtained to the thermoregulator control part 9. The thermoregulator control part 9 performs control (PID, etc.) operation including arithmetic calculations by using the received temperature digital data, and generates an electric signal indicative of a heater power value (0%–100%). A thyristor controller 10 receives the electric signal (0%–100%) from the thermoregulator control part 9 and heats the heater 3 through thyristor firing. Note that an AC power supply 11 is connected to the thermoregulator control part 9 through a main controller 12, and a thermoregulator display operation part 13 is also connected to the thermoregulator control part 9. In addition, an AC power supply 14 is connected to the radiation thermometer 6 and the thermoregulator control part 9.

In order to accurately measure the temperature of the susceptor 4, which is an object to be measured, and to control the temperature of the susceptor 4, the radiation thermometer 6 in this embodiment is arranged in the reaction tube 1a. The reason why the radiation thermometer is used as a temperature sensor is that it is able to perform temperature measurements contactlessly and has good response. In case where the radiation thermometer is replaced with a thermocouple thermometer, it is necessary to mount thermocouples on the susceptor 4 in view of their measurement principle. Accordingly, in this case, the susceptor 4 cannot be rotated. In addition, the thermocouple thermometer is poor in response as compared with the radiation thermometer, and hence is lower in the control performance.

Moreover, the thermocouples 7A–7C in this embodiment are inserted in the heater 3, so that they are arranged in a contactless relation with the atmosphere in a reaction tube chamber 1a and are subjected to no or little characteristic change.

However, in the radiation thermometer, there are observed a characteristic change due to, for example, the adhesion of gas reactants to the susceptor 4, which is an object to be measured, and reduction in the sensor performance due, for example, to the adhesion of gas reactants to the sensor members 6A', 6A–6C of the radiation thermometer 6, in accordance with an increasing number of batches (batch processes). That is, errors are caused in their measurements.

Thus, according to this embodiment, in order to solve this problem, the changing temperature characteristic of the radiation thermometer, i.e., how the measured temperature of the radiation thermometer changes in accordance with the number of repeated batch processes, is examined beforehand in comparison with the thermocouple thermometer having little characteristic change while batch processing in the sheet-feed apparatus is executed repeatedly, and a control parameter (i.e., a difference between the measured values of the radiation thermometer and the thermocouple thermometer in this case) is changed or corrected in accordance with the changing characteristic (measurement errors) so that reliable control can be carried out as in the case of no characteristic change. Hereinafter, this will be explained in detail.

First of all, a temperature difference (i.e., a temperature correction value which is a temperature difference between the actual value of the susceptor temperature measured by the radiation thermometer and the actual value of the heater temperature measured by the thermocouple thermometer) in the steady state of the temperature in the initial state was acquired. Then, a prescribed number of batch processes (for instance, 100 batches) were performed to acquire a temperature difference in the steady state of the temperature in the same manner as described above. In the example of FIG. 2, the temperature difference measured in the heating zone 31 was 50° C. (i.e., zone 31=50° C.) before the batch processing, and the temperature difference measured in the heating zone 32 was 70° C. (i.e., zone 32=70° C.) after the batch processing. The thermocouples 7A–7C were arranged in the vicinity of the heater 3 so as to prevent the thermocouples 7A–7C from being subjected to any remarkable sensor deterioration upon adhesion of gas thereto, etc. Therefore, the temperature set value of the radiation thermometer was corrected with the temperature of the thermocouple thermometer being made as a reference. In this case, the sensor elements of the radiation thermometer and the thermocouples of the thermocouple thermometer which were arranged in the same zones, respectively, corresponded to each other.

When the temperature set value was assumed to be 750° C. for instance in the case where the furnace was controlled so that the measured temperature of the radiation thermometer became a constant temperature (temperature set value), the measured temperature of the radiation thermometer, the measured temperature of the thermocouple thermometer and a difference between these temperatures in the steady state of the temperature in the initial state and those in the 100th batch processing were as follows.

In the initial state:
(1) The measured temperature of the radiation thermometer in the steady state was 749.9° C.
(2) The measured temperature of the thermocouple thermometer in the steady state was 799.9° C.
(3) A temperature difference was 50° C.
In the 100th batch processing:
(1) The measured temperature of the radiation thermometer in the steady state was 749.9° C.
(2) The measured temperature of the thermocouple thermometer in the steady state was 819.9° C.
(3) A temperature difference was 70° C.

When a difference (e.g., 20° C. in the above example) between the temperature differences before and after the batch processing is obtained in this manner, a temperature difference during control operation is obtained at this ratio in accordance with the progress of the batch processing (i.e., the number of batches processed). In this example, the ratio was 0.2° C. per batch. Thus, after the maintenance of hardware (e.g., cleaning of the reaction tube or chamber by means of an etching gas such as $ClF_3$, replacements of parts such as the radiation thermometer, the susceptor, etc.) is carried out once the basic data was obtained, a change in the time series of the temperature difference is acquired again so that correction control can be carried out based thereon. In this case, however, it is thought that the temperature difference in the initial state does not necessarily become 50° C. because of the maintenance of hardware, but the characteristic change is similar. Therefore, the temperature set value (control parameter) to control the radiation thermometer is obtained by doing linear interpolations with respect to the number of batches. A concrete example when the temperature difference in the initial state was assumed to be 53° C. is shown as follows.

In the initial state:
The temperature set value was 750° C. when the furnace was controlled so that the measured value of the radiation thermometer became the temperature set value.
The measured temperature of the radiation thermometer in the steady state was 749.9° C.
The measured temperature of the thermocouple thermometer in the steady state was 802.9° C.
The temperature difference was 53° C.
In the 100th batch processing:
Temperature set value when the furnace was controlled so that the measured value of the radiation thermometer became the temperature set value $$= 750° \text{ C.} - ((70-50)/100) \times 1 - (53-50)$$

$$= 746.8° \text{ C.}$$

The second batch:
Temperature set value when the furnace was controlled so that the measured value of the radiation thermometer became the temperature set value $$= 750° \text{ C.} - ((70-50)/100) \times 2 - (53-50)$$

$$= 746.6° \text{ C.}$$

In the 100th batch processing:
Temperature set value when the furnace was controlled so that the measured value of the radiation thermometer became the temperature set value $$= 750° \text{ C.} - ((70-50)/100) \times 100 - (53-50)$$

$$= 727.0° \text{ C.}$$

Thus, the temperature set value for controlling the furnace such that the radiation thermometer can measure a prescribed temperature set value was corrected by doing a linear interpolation according to the number of batches based on the temperature correction values (i.e., differences between the measured temperatures of the radiation thermometer and the thermocouple thermometer) in the initial state and a designated number of batches (e.g., 100 times) which were acquired beforehand.

As a result, it was possible to perform temperature control in such a manner that the temperature measured by the thermocouple thermometer in the steady state became substantially a constant temperature of 800° C. or therearound irrespective of the number of batches. Accordingly, temperature control with good response could be carried out by the use of the radiation thermometer, and temperature reproducibility during temperature control could be secured, thus making it possible to ensure the uniformity in the film thickness among batches.

In the description of the above-mentioned embodiment, an example has been shown in which in the case of a sheet-feed apparatus, a temperature control parameter in the form of a difference between the measured temperatures of the radiation thermometer and the thermocouple thermometer is determined to correct the temperature set value based thereon, but the present invention can similarly be applied to a vertical apparatus. The correction parameter can also be obtained by correcting, instead of the temperature set value, a variable parameter used for temperature control in a time series manner. Especially, the above considerations can similarly be applied to the case where the temperature sensing ability of internal thermocouples is deteriorated owing to thin films deposited thereon under chemical vapor deposition reactions, as in a vertical type CVD apparatus. For instance, the similar considerations can be applied to the case where when PID control is used for temperature control, temperature histories are made the same by correcting a proportional (P) constant, an integral (I) constant and a differential (D) constant in a time series manner.

For PID control, for instance, the output value of the heater is expressed as follows:

the output value of the heater (0%–100%)=P output value+I output value+D output value.
  (1) P output value (new)=100÷PB×(radiation thermometer target temperature (new)−radiation thermometer measured temperature (new))
  (2) I output value (new)=I output value (old)+ 100÷PB÷Ti×(radiation thermometer target temperature (new)−radiation thermometer measured temperature (new))
  (3) D output value (new)=100÷PB×Td×(radiation thermometer target temperature (new)−radiation thermometer measured temperature (new))−(radiation thermometer target temperature (old)−radiation thermometer measured temperature (old))

Here, note that (old) and (new) designates "before the control cycle" and "after the control cycle", respectively, and hence if the control cycle is one second, (old) indicates one second before (new). Also, PB designates a proportional band (constant). Ti and Td designates integration time and differentiation time, respectively. In the above-mentioned control, by correcting the target temperature of the radiation thermometer according to the number of batches as in the case of the above-mentioned temperature set value, it is possible to perform temperature control with excellent response and accuracy by the use of the radiation thermometer. That is, for instance, it is detected beforehand how the measured value of the radiation thermometer changes in accordance with a prescribed number of batches under the target temperature thereof, and the target temperature is changed at the ratio of the numbers of batches processed during control operation to the prescribed number of batches in accordance with the progress of the batch processing.

The alarm constant is used to sound a warning buzzer or stop a recipe when the difference between the target temperature and the measured temperature becomes more than the alarm constant. The alarm constant is represented as follows.

If |target temperature−measured temperature|≧alarm constant, a warning buzzer is sounded or the recipe is stopped.

For instance, when the target temperature and the measured temperature are 700° C. and 800° C., respectively, that is, when |700−800|=100, if the alarm constant is 50, it is then satisfied that 100≧50, and the above expression becomes true. As a consequence, it is determined that there takes place an abnormal state, so a warning buzzer is sounded or the recipe is stopped. In this case, too, by correcting the target temperature of the radiation thermometer according to the number of batches processed, as in the case of the PID control, it becomes possible to perform excellent temperature control with good response and high accuracy by means of the radiation thermometer.

Finally, as a method for manufacturing semiconductor devices, the present invention can be applied to the following deposition processes, especially in the deposition processing using a CVD method.

(1) Polysilicon Film

When $SiH_4$ is used as a working gas, the temperature control is performed at a deposition temperature in the range of 550° C.–650° C. under reduced pressure.

(2) Doped Polysilicon Film

When $SiH_4$ plus $PH_3$ is used as a working gas, the temperature control is performed at a deposition temperature in the range of 550° C.–650° C. under reduced pressure.

When $Si_2H_6$ plus $PH_3$ is used as a working gas, the temperature control is performed at a deposition temperature in the range of 450° C.–550° C. under reduced pressure.

(3) Nitride ($SiN_4$) Film

When $Si_2Cl_2$ plus $NH_3$ or $SiH_4$ plus $NH_3$ is used as a working gas, the temperature control is performed at a deposition temperature in the range of 750° C.–850° C. under reduced pressure.

(4) $SiO_2$ Film

When SiH4 plus N2O is used as a working gas, the temperature control is performed at a deposition temperature in the range of 750° C.–850° C. under reduced pressure.

Alternatively, when $SiH_2Cl_2$ plus $N_2O$ is used as a working gas, the temperature control is performed at a deposition temperature in the range of 800° C.–900° C. under reduced pressure.

In addition, when $Si(OC_2H_5)_4$ is used as a working gas, the temperature control is performed at a deposition temperature in the range of 700° C.–800° C. under reduced pressure.

Moreover, when $SiH_4$ plus $O_2$ is used as a working gas, the temperature control is performed at a deposition temperature in the range of 350° C.–450° C. under reduced pressure.

The above-mentioned processes (1) and (2) are used for fabrication of gate electrodes and wiring layers of MOS memories, resistors of SRAMs and so on.

Furthermore, the above-mentioned process (3) is used for the fabrication of oxidation preventive layers or overcoats in a LOCUS method that is one technique for separation of dielectric materials in an element separation technology of avoiding electric interference among individual elements. For instance, it is used for the fabrication of MOSFETs for charge input and output control in DRAMs. Additionally, it is also used for the fabrication of capacitor or gate insulation films of MOS memories.

Moreover, the above-mentioned process (4) is used for the fabrication of interlayer insulation films, passivation films, etc., of MOS memories.

As described above, according to the present invention, it is possible to prevent the temperature correction value, which specifies a temperature difference between the radiation thermometer and the thermocouple thermometer, from becoming meaningless as a result of the temperature difference being changed in accordance with a characteristic change of the furnace or the sensor (e.g., due to gas adhesion, heater characteristic change, etc.) as the number of repeated batch processes (wafer depositions) increases. As a result, even if a plurality of batch processes (wafer depositions) are repeatedly carried out, uniform temperature control over the surface of a wafer can be effected, thus ensuring uniformity in the thickness of thin films formed thereon as well as an improvement in wafer quality. Similarly, it is also possible to prevent the PID constants, alarm constant and other critical or decisive parameters of temperature control parameters from becoming unable to play the intended role of the temperature control parameters due to the characteristic change of the furnace and/or the sensor (gas adhesion, heater characteristic change, etc.) as much as possible. Here, note that the temperature control method and the method for manufacturing semiconductor devices according to the present invention can be applied not only to the deposition processing according to a CVD method, but also to thermal treatment apparatuses including an oxidation apparatus using oxidizing gases such as $H_2O$, $O_2$, etc., an impurity diffusion apparatus, an annealing apparatus and so on.

As described in detail in the foregoing, according to the present invention, by making a temperature control parameter to be changed in accordance with a change in the measurement error of a temperature sensor, it is possible to maintain the accuracy of the temperature control based on the detected value of the temperature sensor substantially constant regardless of the change in the measurement error of the temperature sensor. Accordingly, in case where a radiation thermometer is used as the temperature sensor, the temperature control can be performed without impairing the control accuracy even if there is caused a change in the measurement error of the radiation thermometer due to the deposition of films thereon, etc.

While the invention has been described in terms of a preferred embodiment, those skilled in the art will recognize that the invention can be practiced with modifications within the spirit and scope of the appended claims.

What is claimed is:

1. A temperature control method for performing temperature control, comprising:

in advance of an actual batch process, acquiring detected temperature values of several batches using a control temperature sensor and a reference temperature sensor; and determining temperature correction values for said respective several batches against a temperature set value of said control temperature sensor based on said detected temperature values, in an actual batch process, said temperature control being performed based on at least one of said temperature correction values for said respective several batches and a detected temperature value of said control temperature sensor.

2. The temperature control method according to claim 1, wherein said temperature correction values for said respective several batches are determined based on:

an initial temperature difference between said detected temperature values of said reference temperature sensor and those of said control temperature sensor;

a temperature difference between said detected temperature values of said reference temperature sensor and those of said control temperature sensor after a prescribed number of said batches are processed; and a number of said processed batches.

3. The temperature control method according to claim 1, wherein said control temperature sensor is arranged in a contact relation with an atmosphere in a reaction chamber of a processing apparatus and said reference temperature sensor is arranged in a contactless relation with an atmosphere in said reaction chamber of said processing apparatus.

4. The temperature control method according to claim 3, wherein said control temperature sensor comprises a radiation thermometer and said reference temperature sensor comprises a thermocouple thermometer.

5. The temperature control method according to claim 3, wherein said processing apparatus comprises a chemical vapor deposition (CVD) apparatus in which a reactive gas is supplied thereto and the used gas is degassed therefrom to form thin films on a substrate.

6. A method for manufacturing semiconductor devices, comprising:

in advance of an actual batch process, acquiring detected temperature values of several batches using a control temperature sensor and a reference temperature sensor; and determining temperature correction values for said respective several batches against a temperature set value of said control temperature sensor based on said detected temperature values, in an actual batch process, a temperature control of a heater provided in a reaction chamber being performed based on at least one of said temperature correction values for said respective several batches and a detected temperature value of said control temperature sensor, and a reactive gas being supplied to said reaction chamber and the used gas being degassed therefrom to form thin films on a substrate heated by said heater.

7. The temperature control method according to claim 1, wherein said control temperature sensor is disposed in a reaction chamber of a processing apparatus and said reference temperature sensor is disposed outside of said reaction chamber of said processing apparatus.

8. The temperature control method according to claim 3, wherein said control temperature sensor comprises a radiation thermometer.

9. The temperature control method according to claim 3, wherein said reference temperature sensor comprises a thermocouple thermometer.

10. The temperature control method according to claim 3, wherein said processing apparatus comprises a chemical vapor deposition apparatus.

11. The temperature control method according to claim 3, wherein a reactive gas is supplied to said chemical vapor deposition apparatus to form thin films on a substrate.

12. The temperature control method according to claim 3, wherein the used gas is degassed therefrom.

13. A temperature control method, comprising:

acquiring detected temperature values of several batches in advance of an actual batch process;

determining temperature correction values for said respective several batches against a temperature set value based on said detected temperature values; and performing temperature control in an actual batch process based on at least one of said temperature correction values and a detected temperature value.

14. The temperature control method according to claim 13, wherein said acquiring detected temperature values comprises acquiring detected temperature values using a control temperature sensor and a reference temperature sensor.

15. The temperature control method according to claim 13, wherein said temperature set value comprises a temperature set value of a control temperature sensor.

16. The temperature control method according to claim 3, wherein said processing apparatus comprises a heater.

17. The temperature control method according to claim 8, wherein said radiation thermometer is disposed in a vicinity of a susceptor in the reaction chamber of said processing apparatus.

18. The temperature control method according to claim 8, wherein said radiation thermometer comprises a plurality of sensor members.

19. The temperature control method according to claim 9, wherein said thermocouple thermometer comprises a plurality of thermocouples.

* * * * *